(12) United States Patent
Huang et al.

(10) Patent No.: US 8,600,081 B2
(45) Date of Patent: Dec. 3, 2013

(54) AUDIO SIGNAL AMPLIFYING CIRCUIT

(75) Inventors: Ren-Wen Huang, Shenzhen (CN); Jun-Wei Zhang, Shenzhen (CN); Jun Zhang, Shenzhen (CN); Lin-Kun Ding, Shenzhen (CN); Tsung-Jen Chuang, Tu-Cheng (TW)

(73) Assignees: Fu Tai Hua Industry (Shenzhen) Co., Ltd., Shenzhen (CN); Hon Hai Precision Industry Co., Ltd., New Taipei (TW)

( * ) Notice: Subject to any disclaimer, the term of this patent is extended or adjusted under 35 U.S.C. 154(b) by 335 days.

(21) Appl. No.: 13/106,807

(22) Filed: May 12, 2011

(65) Prior Publication Data

US 2012/0207330 A1    Aug. 16, 2012

(30) Foreign Application Priority Data

Feb. 16, 2011 (CN) .......................... 2011 1 0041457

(51) Int. Cl.
 *H03F 99/00* (2009.01)
(52) U.S. Cl.
 USPC ................ 381/120; 381/28; 381/104; 330/51

(58) Field of Classification Search
 USPC .......... 381/120, 104, 111, 123, 107, 109, 28; 330/51
 See application file for complete search history.

(56) References Cited

U.S. PATENT DOCUMENTS

| 3,706,098 A | * | 12/1972 | Geiger | ............................ 246/40 |
| 2005/0195991 A1 | * | 9/2005 | Wang et al. | .................. 381/94.5 |
| 2009/0034141 A1 | * | 2/2009 | Tonry et al. | ..................... 361/92 |

OTHER PUBLICATIONS

Paul Horowitz and Winfield Hill, The Art of Electronics, 1989, Cambridge University Press, 2nd Edition, pp. 84 and 85.*

* cited by examiner

*Primary Examiner* — Vivian Chin
*Assistant Examiner* — Friedrich W Fahnert
(74) *Attorney, Agent, or Firm* — Altis & Wispro Law Group, Inc.

(57) ABSTRACT

The present disclosure provides an audio signal amplifying circuit for an electronic device including a processing chip and a speaker. The audio signal amplifying circuit includes an amplifying circuit and an inverting circuit connected to the processing chip to get a first control signal and invert the first control signal to generate a second control signal. The first control signal and/or the second control signal are used to control the operation mode of the amplifying circuit to be in an amplifying mode or in a non-amplifying mode.

8 Claims, 2 Drawing Sheets

AUDIO SIGNAL AMPLIFYING CIRCUIT

BACKGROUND

1. Technical Field

The present disclosure relates to audio signal processing circuits and, more particularly, to an audio signal amplifying circuit.

2. Description of Related Art

Conventional audio signal amplifying circuit can amplify audio signals, which satisfies basic requirements of a user, but usually such an audio signal amplifying circuit is complex. A simple audio signal amplifying circuit is therefore desired.

BRIEF DESCRIPTION OF THE DRAWINGS

The components in the drawings are not necessarily drawn to scale, the emphasis instead being placed upon clearly illustrating the principles of the present disclose. Moreover, in the drawings, like reference numerals designate corresponding parts throughout the several views.

DETAILED DESCRIPTION

The disclosure is illustrated by way of example and not by way of limitation. It should be noted that references to "an" or "one" embodiment in this disclosure are not necessarily to the same embodiment, and such references mean at least one.

Figure 1:
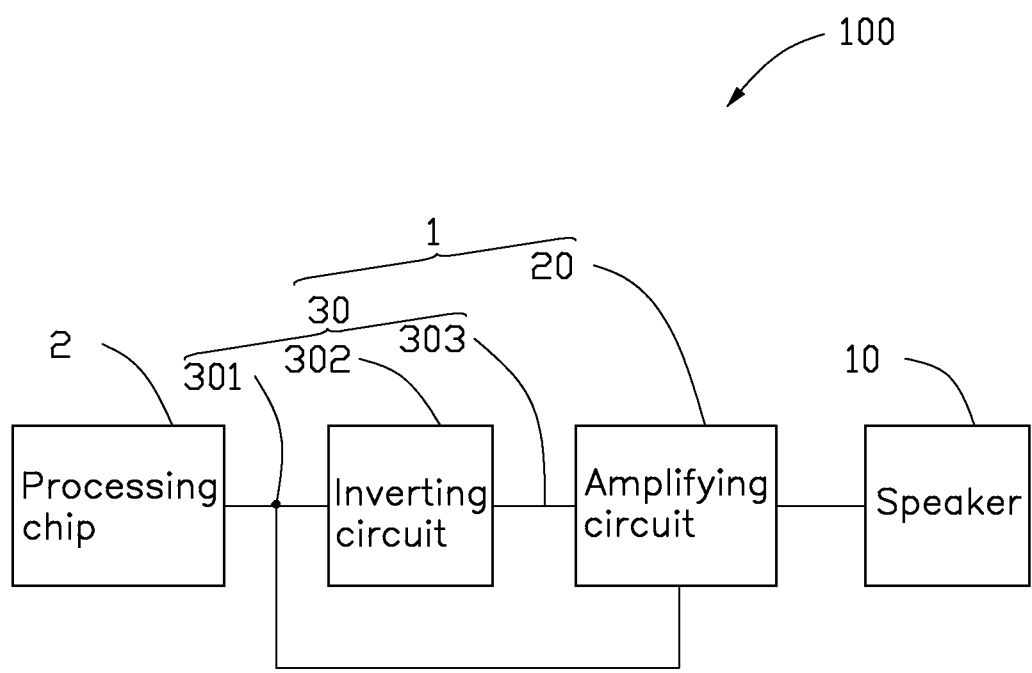
FIG. 1 is a block diagram of an electronic device using an audio signal amplifying circuit in accordance with an exemplary embodiment.

Referring to FIG. 1, an audio signal amplifying circuit 1 is housed in an electronic device 100 including a processing chip 2 and a speaker 10. The audio signal amplifying circuit 1 is used to amplify audio signals generated by playing audio files and/or video files of the device 100 and transmit the amplified audio signals to the speaker 10.

The audio signal amplifying circuit 1 includes an amplifying circuit 20 and a control signal generating circuit 30. The amplifying circuit 20 is connected between the control signal generating circuit 30 and the speaker 10. The control signal generating circuit 30 is connected between the processing chip 2 and the amplifying circuit 20. The control signal generating circuit 30 generates control signals to switch operation modes of the amplifying circuit 20 between an amplifying state and a non-amplifying state. In the amplifying state, the amplifying circuit 20 amplifies audio signals. In the non-amplifying state, the amplifying circuit 20 does not amplify audio signals.

In this embodiment, the control signal generating circuit 30 includes a first port 301, an inverting circuit 302, and a second port 303. The inverting circuit 302 is electrically connected to a pin of the processing chip 2 through the first port 301 and connected to the amplifying circuit 20 through the second port 303. The inverting circuit 302 receives a first control signal from the processing chip 2 through the first port 301 and inverts the first control signal to generate a second control signal. The first control signal and the second control signal are output to the amplifying circuit 20. The amplifying circuit 20 switches the operation mode thereof according to the first control signal and/or the second control signal. That is, the amplifying circuit 20 switches the operation mode thereof when the first control signal is changed. For example, in this embodiment, the amplifying circuit 20 switches the operation mode according to the first control signal. When the first control signal is a high positive voltage (e.g., +3V), the operation state of the amplifying circuit 20 is in the non-amplifying state. When the first control signal is changed from the high positive voltage to the high negative voltage, the operation mode of the amplifying circuit 20 is correspondingly changed from the non-amplifying state to the amplifying state. In other embodiments, the amplifying circuit 20 switches the operation mode according to the second control signal or the combination of the first and second control signals.

Figure 2:
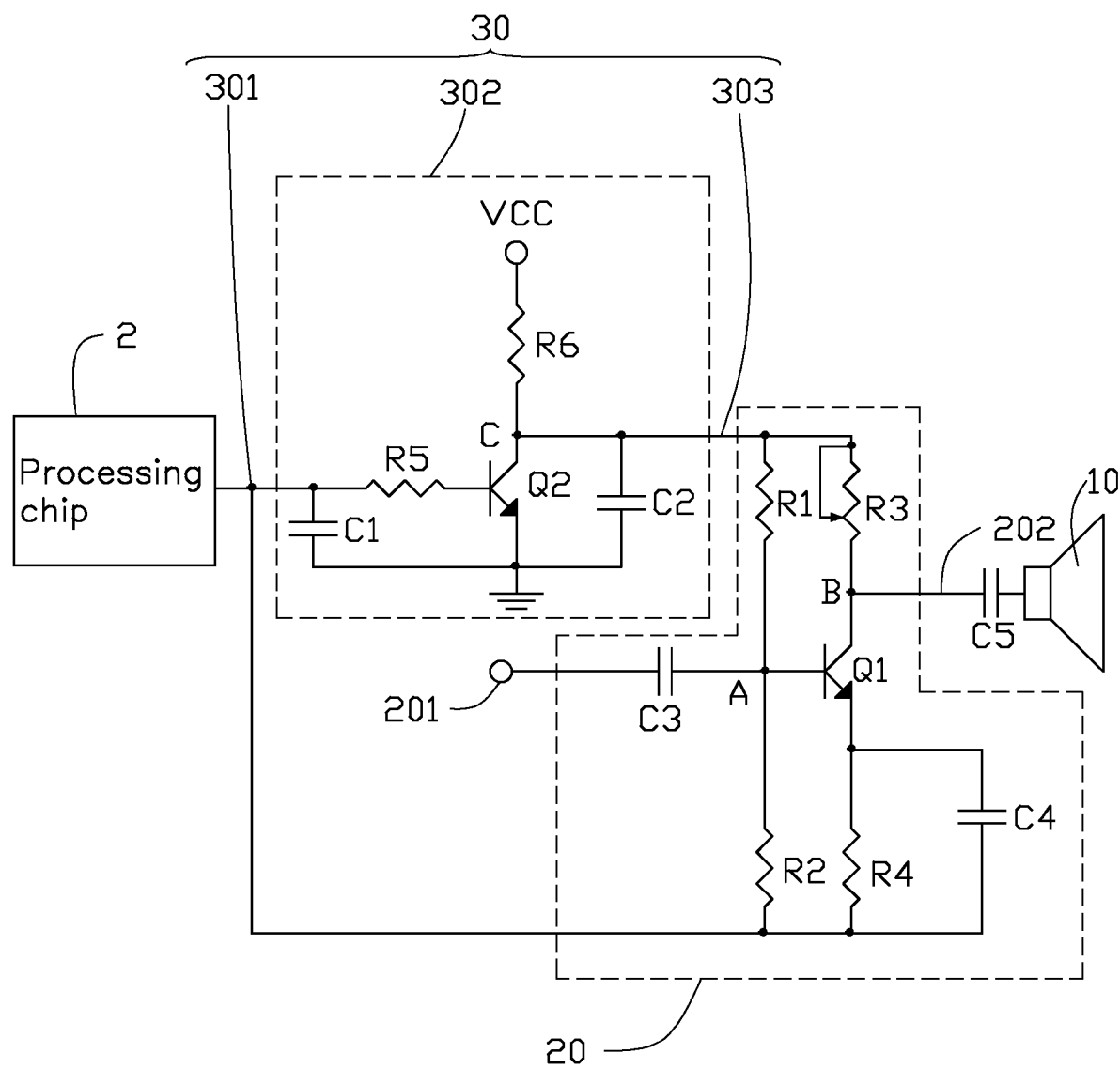
FIG. 2 is a circuit diagram of the audio signal amplifying circuit of FIG. 1 in accordance with an exemplary embodiment.

Referring to FIG. 2, the amplifying circuit 20 includes a first resistor R1, a second resistor R2, a third resistor R3, a fourth resistor R4, a signal input port 201, a signal output port 202, and a first switch Q1 turned on when the first control signal is the high negative voltage. In this embodiment, the first switch Q1 is an NPN transistor. In an alternative embodiment, the first switch Q1 is an NMOS transistor. At least one of the third resistor R3 and the fourth resistor R4 is a rheostat. In this embodiment, only the third resistor R3 is the rheostat. The first resistor R1 and the second resistor R2 are connected in series between the first port 301 and the second port 303. A base of the first switch Q1 is connected to the first resistor R1 and the second resistor R2, and a first node A is formed among the first resistor R1, the second resistor R2, and the base of the first switch Q1. A collector of the first switch Q1 is connected to the second port 303 through the third resistor R3, and an emitter of the first switch Q1 is connected to the first port 301 through the fourth resistor R4. The signal input port 201 is connected to the first node A and used to input audio signals generated by playing audio/video files of the electronic device 100 to the amplifying circuit 20. The speaker 10 is connected to the third resistor R3 and the collector of the first switch Q1, and a second node B is formed among the third resistor R3, the collector of the first switch Q1, and the speaker 10. The second node B is taken as the signal output port 202 of the amplifying circuit 20. With such configuration, a common-emitter amplifying circuit is thus formed by the first switch Q1, the resistors R1, R2, R3, and R4.

When the first control signal from the first port 301 is the high positive voltage, the second control signal from the second port 303 is the high negative voltage. The voltage of the base of the first switch Q1 is lower than that of the emitter of the first switch Q1, the first switch Q1 is thus turned off. A part of the current from the first port 301 is transmitted to the second port 303 through the second resistor R2, the base of the switch Q1, the collector of the switch Q1, and the third resistor R3. Audio signals received by the signal input port 201 are correspondingly transmitted to the signal output port 202 from the base and the collector of the switch Q1. The audio signals from the signal output port 202 are substantially the same as the audio signals from the signal input port 201 because the resistance value between the base and the collector of the first switch Q1 is very small. Therefore, the audio signals generated by playing the audio/video files are not amplified by the amplifying circuit 20. That is, when the first control signal is the high positive voltage, the amplifying circuit 20 is in the non-amplifying state.

When the first control signal from the first port 301 is the high negative voltage, the second control signal from the second port 303 is the high positive voltage. The voltage of the base of the first switch Q1 is greater than that of the emitter of the first switch Q1, the first switch Q1 is thus turned on. When the first switch Q1 is turned on, the amplifying circuit 20 is the common-emitter amplifying circuit with an amplification factor to amplify audio signals from the signal input port 201 and transmit the amplified audio signals to the signal output port 202.

The amplification factor of the common-emitter amplifying circuit is $\beta*R3/R4$, wherein the $\beta$ is an amplifying coefficient of the first switch Q1, and the R3 and the R4 are resistance values of the resistors R3 and R4 respectively. In this embodiment, the amplification factor of the amplifying circuit 20 can be changed by changing input resistance value of the R3. In this embodiment, the resistance values of the first resistor R1 and the second resistor R2 are respectively about 10KΩ, the resistance value of the fourth resistor R4 is about 1KΩ, and the greatest resistance value of the third resistor R3 is about 10 KΩ.

In this embodiment, the inverting circuit 302 includes a second switch Q2 turned on when the first control signal is the high positive voltage, a fifth resistor R5, a sixth resistor R6, and a voltage port Vcc connected to a power source (not shown) to provide a high positive voltage. In this embodiment, the second switch Q2 is an NPN transistor. In an alternative embodiment, the second switch Q2 is an NMOS transistor. A base of the switch Q2 is connected to the first port 301 through the fifth resistor R5, a collector of the switch Q2 is connected to the voltage port Vcc through the sixth resistor R6, and an emitter of the switch Q2 is grounded. A third node C among the collector of the switch Q2, the sixth resistor R6, and the amplifying circuit 20 is taken as the second port 303 of the inverting circuit 302. When the first port 301 receives a high positive voltage from the processing chip 2, the second switch Q2 is turned on because the emitter of the second switch Q2 is grounded, the signal to the second port 303 is thus the high negative voltage. When the first port 301 receives a high negative voltage from the processing chip 2, the switch Q2 is turned off, and the second control signal to the second port 303 is the high positive voltage the voltage port Vcc provides. In this embodiment, the resistance values of the fifth resistor R5 and the sixth resistor R6 are respectively about 2K and 1K.

In this embodiment, the audio signal amplifying circuit 1 further includes a first capacitor C1, a second capacitor C2, a third capacitor C3, a fourth capacitor C4, and a fifth capacitor C5, all of which are for filtering noises. The first capacitor C1 is connected between the first port 301 and the emitter of the second switch Q2. The second capacitor C2 is connected between the collector of the second switch Q2 and the emitter of the second switch Q2. The third capacitor C3 is connected between the signal input port 201 and the first node A. The fourth capacitor C4 is connected between the emitter of the first switch Q1 and the first port 301. The fifth capacitor C5 is connected between the signal output port 202 and the speaker 10. In this embodiment, the capacitance values of the first capacitor C1, the second capacitor C2, and the fourth capacitor C4 are respectively about 1 µF and the capacitance values of the third capacitor C3 and the fifth capacitor C5 are respectively about 10 µF.

Although the present disclosure has been specifically described on the basis of the exemplary embodiment thereof, the disclosure is not to be construed as being limited thereto. Various changes or modifications may be made to the embodiment without departing from the scope and spirit of the disclosure.

What is claimed is:

1. An audio signal amplifying circuit for an electronic device comprising a processing chip and a speaker, the audio signal amplifying circuit comprising:
    a control signal generating circuit comprising:
        a first port connected to a pin of the processing chip to receive a first control signal from the processing chip;
        a second port; and
        an inverting circuit connected between the first port and the second port to invert the first control signal from the first port to generate a second control signal; and
    an amplifying circuit comprising a first resistor, a second resistor, a third resistor, a fourth resistor, a signal input port, a signal output port, and a first switch, wherein the amplifying circuit switches an operation mode thereof according to the first control signal and/or the second control signal, the first resistor and the second resistor are connected in series between the first port and the second port, a base of the first switch is connected to the first resistor and the second resistor respectively, a first node is formed among the first resistor, the second resistor, and the base of the first switch, the signal input port is connected to the first node to input audio signals generated by playing audio/video files of the electronic device to the amplifying circuit, a collector of the first switch is connected to the second port through the third resistor, an emitter of the first switch is connected to the first port through the fourth resistor, a second node is formed among the third resistor, the collector of the first switch, and the speaker, and the second node is used as a signal output port of the amplifying circuit;
    wherein the operation modes of the amplifying circuit comprise an amplifying mode and a non-amplifying mode;
    wherein, when the first control signal from the first port is a high positive voltage, the amplifying circuit is in the non-amplifying mode, and audio signals from the signal output port is substantially the same as audio signals from the signal input port; and
    wherein, when the first control signal from the first port is a high negative voltage, the amplifying circuit is in the amplifying mode, and audio signals from the signal input port are amplified and transmitted to the speaker through the signal output port.

2. The audio signal amplifying circuit as described in claim 1, wherein the inverting circuit comprises a second switch, a fifth resistor, a sixth resistor, and a voltage port used to provide a high positive voltage, the second switch is turned on when the first control signal is the high positive voltage, a base of the second switch is connected to the first port through the fifth resistor, a collector of the second switch is connected to the voltage port through the sixth resistor, an emitter of the second switch is grounded, a third node is formed among the collector of the second switch, the sixth resistor and the amplifying circuit, and the third node is taken as the second port.

3. The audio signal amplifying circuit as described in claim 2, further comprising a first capacitor, a second capacitor, a third capacitor, a fourth capacitor, and a fifth capacitor, wherein the first capacitor is connected between the first port and the emitter of the second switch, the second capacitor is connected between the collector and the emitter of the second switch, the third capacitor is connected between the signal input port and the base of the first switch, the fourth capacitor is connected between the emitter of the first switch and the first port, and the fifth capacitor is connected between the signal output port and the speaker.

4. The audio signal amplifying circuit as described in claim 3, wherein the capacitance values of the first capacitor, the second capacitor, and the fourth capacitor are respectively about 1 µF and the values of the third capacitor C3 and the fifth capacitor C5 are respectively about 10 µF.

5. The audio signal amplifying circuit as described in claim 1, wherein the first switch is an NPN transistor or an NMOS transistor.

6. The audio signal amplifying circuit as described in claim 2, wherein the second switch is an NPN transistor or an NMOS transistor.

7. The audio signal amplifying circuit as described in claim 2, wherein at least one of the third resistor and the fourth resistor is a rheostat.

8. The audio signal amplifying circuit as described in claim 2, wherein the resistance values of the first resistor and the second resistor are respectively about 10 KΩ, the resistance value of the fourth resistor is about 1 KΩ, and the third resistor is a rheostat with a greatest resistance value of about 10 KΩ.

* * * * *